(12) United States Patent
Kaski (10) Patent No.: US 7,119,799 B2
(45) Date of Patent: Oct. 10, 2006

(54) METHOD AND APPARATUS FOR MONITORING WET CONTACT TOUCHPADS

(75) Inventor: Kurt R. Kaski, Lake Norden, SD (US)

(73) Assignee: Daktronics, Inc., Brookings, SD (US)

( * ) Notice: Subject to any disclaimer, the term of this patent is extended or adjusted under 35 U.S.C. 154(b) by 368 days.

(21) Appl. No.: 10/715,085

(22) Filed: Nov. 17, 2003

(65) Prior Publication Data

US 2005/0104862 A1 May 19, 2005

(51) Int. Cl.
*G09G 5/08* (2006.01)

(52) U.S. Cl. .................... 345/173; 341/20; 200/600

(58) Field of Classification Search ............... 345/173, 345/174; 341/20; 200/600; 400/479.1
See application file for complete search history.

(56) References Cited

U.S. PATENT DOCUMENTS 3,920,940 A * 11/1975 Brown et al. ............. 200/52 R
4,263,736 A * 4/1981 Beierwaltes et al. .......... 40/452
4,700,369 A * 10/1987 Siegal et al. ............... 377/24.2
5,285,428 A * 2/1994 Rosow et al. ............... 368/107
5,702,799 A * 12/1997 Brown et al. ............... 428/143

\* cited by examiner

*Primary Examiner*—Timothy Edwards, Jr.
(74) *Attorney, Agent, or Firm*—Hugh D. Jaeger, Esq.

(57) ABSTRACT

Method and apparatus for monitoring wet contact touchpads where the opening of the contacts and the closing of the contacts of a wet contact touchpad are monitored and sensed by a timer/controller. The wet contact touchpad forms a capacitor which is charged to maintain a low voltage when the contacts are open. Upon reaching a predetermined decreasing voltage charge across the wet contact touchpad, the voltage status is further scrutinized by voltage sampling to determine when a contact closure or a contact break has occurred. Such determination is carried out in multiple cycle fashion by quickly and repeatedly introducing a charge voltage, discontinuing the charge voltage, and sampling the charged voltage to determine a decrease or an increase. A decrease indicates a wet contact touchpad closed circuit and an increase indicates a wet contact touchpad open circuit. Sampling of the increasing or decreasing charges determines timed occurrences accurately.

16 Claims, 7 Drawing Sheets

PRIOR ART

METHOD AND APPARATUS FOR MONITORING WET CONTACT TOUCHPADS

CROSS REFERENCES TO RELATED APPLICATIONS

None.

BACKGROUND OF THE INVENTION

1. Field of the Invention

The present invention is for a sports timing device and, more particularly, for a method and apparatus for monitoring wet contact touchpads in a swim timing system that allows accurate detection of both the actuation of and the release of a switch-like wet contact touchpad while preventing corrosion of the switch contact material. More particularly, the wet contact touchpads consist of flexible metal electrode plates separated by non-conducting spacers forming a simple switch. The space between the flexible metal electrode plates is allowed to fill with water when the wet contact touchpad is placed in a pool. The large parallel flexible metal electrode plates separated by water form a large capacitor which must be charged up by the monitoring circuit before a switch closure can be sensed. The potential across the plates must not exceed the ionization voltage of water (~1.3V) or corrosion will occur.

2. Description of the Prior Art

In prior art devices, the capacitance formed by the opposing flexible metal electrode plates of a wet contact touchpad does not present a significant problem if only closures need to be monitored because the voltage across the plates will change rapidly when they are shorted together. Accurately detecting the release is more difficult. A wet contact touchpad can be modeled as a large capacitor in series with a small resistor. A common charging method is to pull one flexible metal electrode plate of the wet contact touchpad up to a voltage less than 1.3V, which results in a series RC circuit where the voltage across the capacitor formed by the flexible metal electrode plates is an exponential function of time. The large wet contact touchpad capacitance makes the time constant of this circuit too large to allow accurate sensing of the release.

Directly monitoring the voltage across the wet contact touchpad while charging is impractical because of the series resistance in the wet contact touchpad model. The voltage across the capacitor plus the voltage drop across the resistor will always equal the full charging voltage. In addition, the capacitance and the resistance in the wet contact touchpad model are not fixed and may vary depending on wet contact touchpad age, size, and pool chemistry, which makes simple level detector circuits inadequate.

SUMMARY OF THE INVENTION

The present invention utilizes a sensing and switching approach method and apparatus to accurately detect the touch and the release of a wet contact touchpad by sampling rates of decreasing or increasing voltage sampled between rapidly occurring charging cycles. To foster accuracy and to provide an adequate number of samples, the time required to charge the wet contact touchpad is reduced by charging with a significant level of high voltage, thereby reaching the charge-up voltage with a minimum amount of time. The charging circuit is then electronically disconnected when the wet contact touchpad reaches a desired voltage charge. This is accomplished using a microcontroller interfaced to an analog-to-digital converter (ADC) for monitoring the voltage, and a transistor switch arrangement to control the charging circuit. The microcontroller continually samples the wet contact touchpad charge voltage through the ADC, and signals a "touch" when n number of decreasing voltage samples in a row are detected. The microcontroller then switches the charging circuit on in preparation for sensing the release.

The problem with the wet contact touchpad series resistance is solved by switching the charging circuit off before sampling the voltage. With no charging current through the internal resistance, there will be no voltage drop across it, and the voltage across the capacitance can be sampled. This process repeats: turn charger on, turn charger off, sample, turn charger on . . . etc. Successive samples are compared, and n number of increasing samples in a row indicate that the wet contact touchpad is released and is charging back up. The microcontroller continues this charge/sample cycle until the wet contact touchpad is completely charged. If the sample rate is fast enough, small changes of the resistance and capacitance will not significantly affect the accuracy of this method. This is because differences between samples are compared, rather than comparing each sample to a fixed threshold.

There is also another possibility for even more accurate sensing using a variation of this method and a little more mathematical processing. From the samples taken during the charging of the wet contact touchpad, the RC time constant of the circuit could be calculated (approximated). The time constant and the present voltage level could then be used to calculate how long the wet contact touchpad had been charging. Subtracting this amount of time from the present time would yield the time at which the release occurred.

One significant aspect and feature of the present invention is a method and apparatus for accurately detecting the touching and releasing of a wet contact touchpad.

Another significant aspect and feature of the present invention is a method and apparatus for accurately monitoring the state of voltage charge of a wet contact touchpad.

A further significant aspect and feature of the present invention is a method and apparatus for accurately detecting the touching of a wet contact pad when n number of decreasing voltage samples in a row are sensed.

A further significant aspect and feature of the present invention is a method and apparatus for accurately detecting the release of a wet contact pad when n number of increasing voltage samples in a row are sensed.

Still another significant aspect and feature of the present invention is a method and apparatus for accurately detecting reaction time between a signaled start involving the reaction time between constant or near constant touching of a wet contact touchpad and release of the wet contact switch.

Yet another significant aspect and feature of the present invention is a method and apparatus for accurately detecting the touching and releasing of a wet contact touchpad whereby a suitable non-corrosive low voltage is incorporated to promote accuracy and long life of the wet contact touchpads.

Having thus mentioned certain significant aspects and features, or described embodiments, of the present invention, it is the principal object of the present invention to provide a method and apparatus for accurately detecting the touching and releasing of flexible metal electrode plates of a wet contact touchpad and for the prevention of corrosive forces upon the flexible metal electrode plates of a wet contact touchpad.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENT

Figure 1:
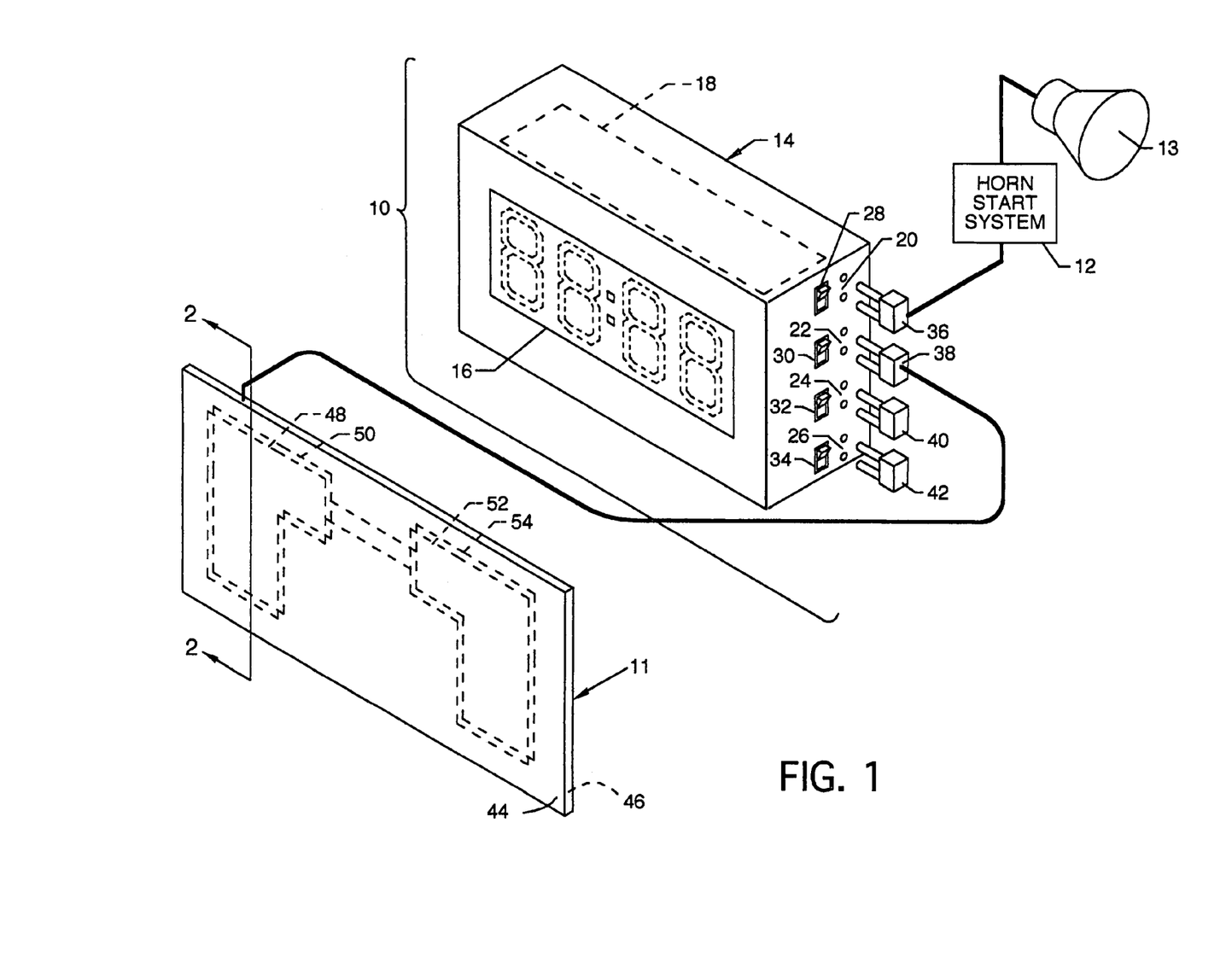
FIG. 1 is an isometric view of the apparatus for monitoring wet contact touchpads, the present invention, shown in electrical connection with and in use with a wet contact touchpad, a horn start system, and an external start horn.

FIG. 1 is an isometric view of the apparatus for monitoring wet contact touchpads 10, the present invention, shown in electrical connection with and in use with a wet contact touchpad 11, a horn start system 12, and an external start horn 13. A suitably housed timer/controller 14 includes, but is not limited to, an electronic display 16, which could be any suitable numerical display, such as a liquid crystal display, an LED or the like, a microcontroller 18, paired START jacks 20, paired STOP jacks 22, paired RESET jacks 24, paired HORN jacks 26, switches connected to the above jacks including a start switch 28, a stop switch 30, a reset switch 32 and a horn switch 34, respectively, and plugs which can connect to the above jacks including a start plug 36, a stop plug 38, a reset plug 40 and a horn plug 42. The wet contact touchpad 11 can include opposing front and rear panels 44 and 46 of flexible non-conducting material, such as plastic, having one or more opposing flexible metal electrode plates 48 and 50 and opposing flexible metal electrode plates 52 and 54 located, respectively as illustrated, on the interior faces of the opposing non-conducting front and rear panels 44 and 46. A plurality of non-conducting separators 56a–56n (FIG. 2), which could be foam, distance the front and rear panels 44 and 46 and, thus, the opposing flexible metal electrode plates 48 and 50 and opposing flexible metal electrode plates 52 and 54, thereby forming a capacitor which is submersible.

Figure 2:
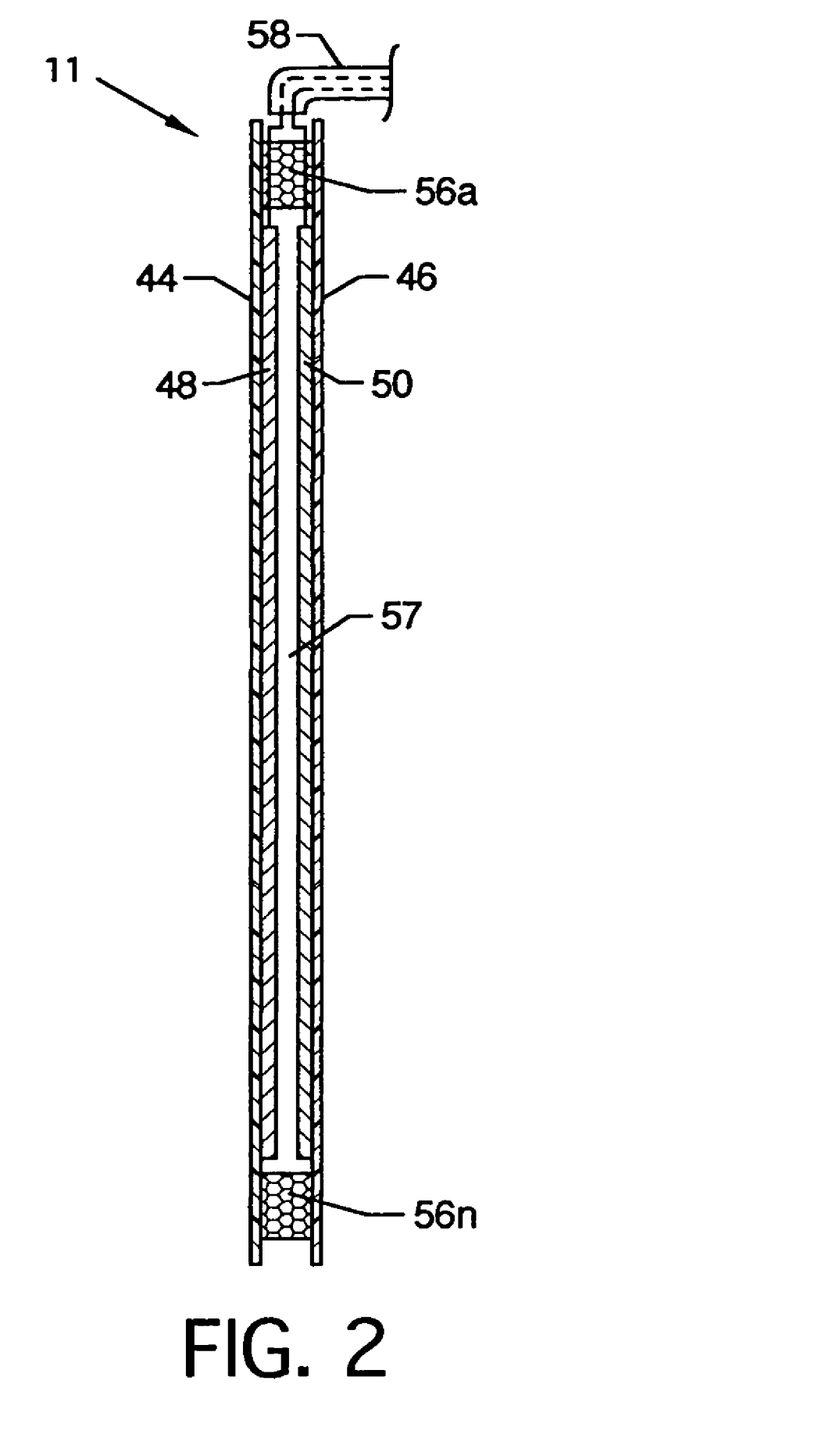
FIG. 2 is a cross section view of the wet contact touchpad along line 2—2 of FIG. 1.

FIG. 2 is a cross section view of the wet contact touchpad 11 along line 2—2 of FIG. 1. Shown in particular is the location of several of the opposing non-conducting separators 56a–56n which separate the non-conducting front panel 44 and the non-conducting rear panel 46 and, thus, the flexible metal electrode plates 48 and 50 (and 52 and 54). The space 57 between the flexible metal electrode plates 48 and 50 (and flexible metal electrode plates 52 and 54) is allowed to fill with water, which is a dielectric. The flexible metal electrode plate pairs 48 and 50 and 52 and 54 are separated by the water (dielectric) and therewith form a large capacitor. Also shown is a connection cable 58 connected across the flexible metal electrode plates 48 and 50. The pairs of flexible metal electrode plates 48 and 50 and 52 and 54 are interconnected, such as is shown in FIG. 1.

Figure 3:
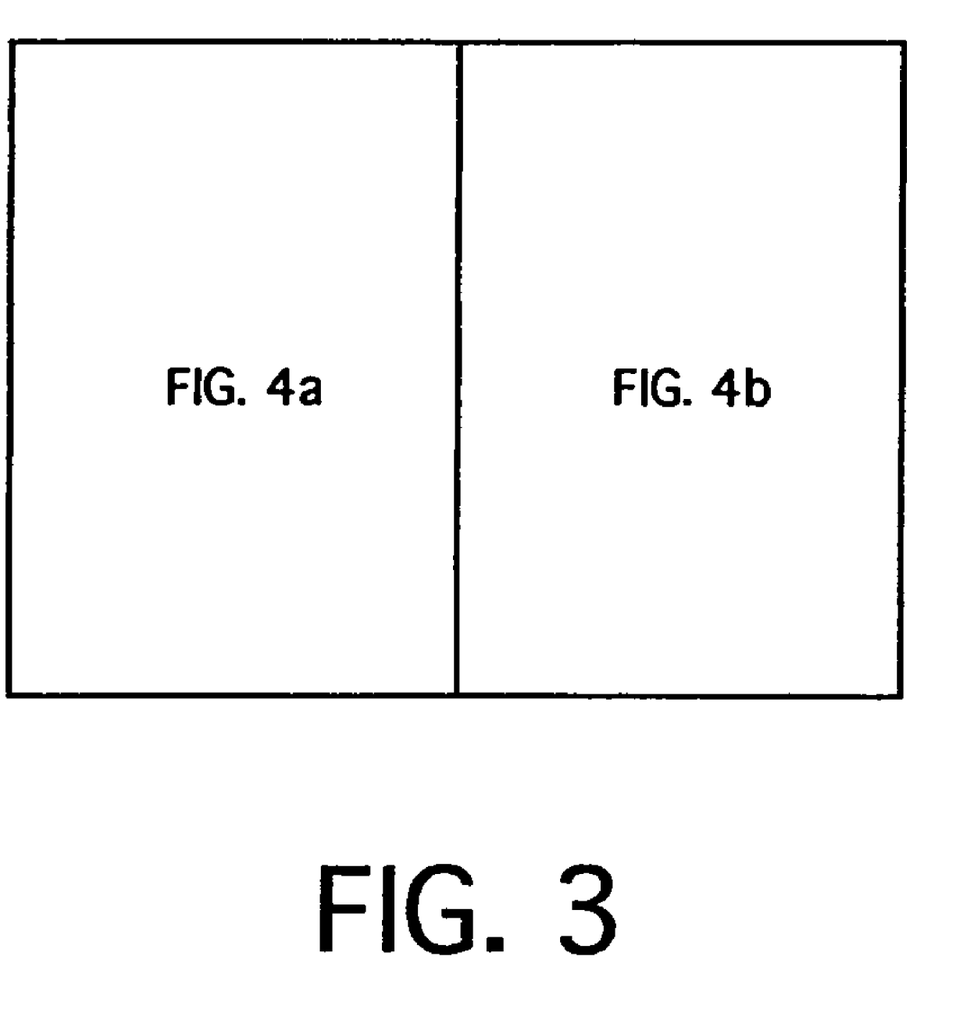
FIG. 3 illustrates the alignment of FIG. 4a with respect to FIG. 4b.
Figure 4A:
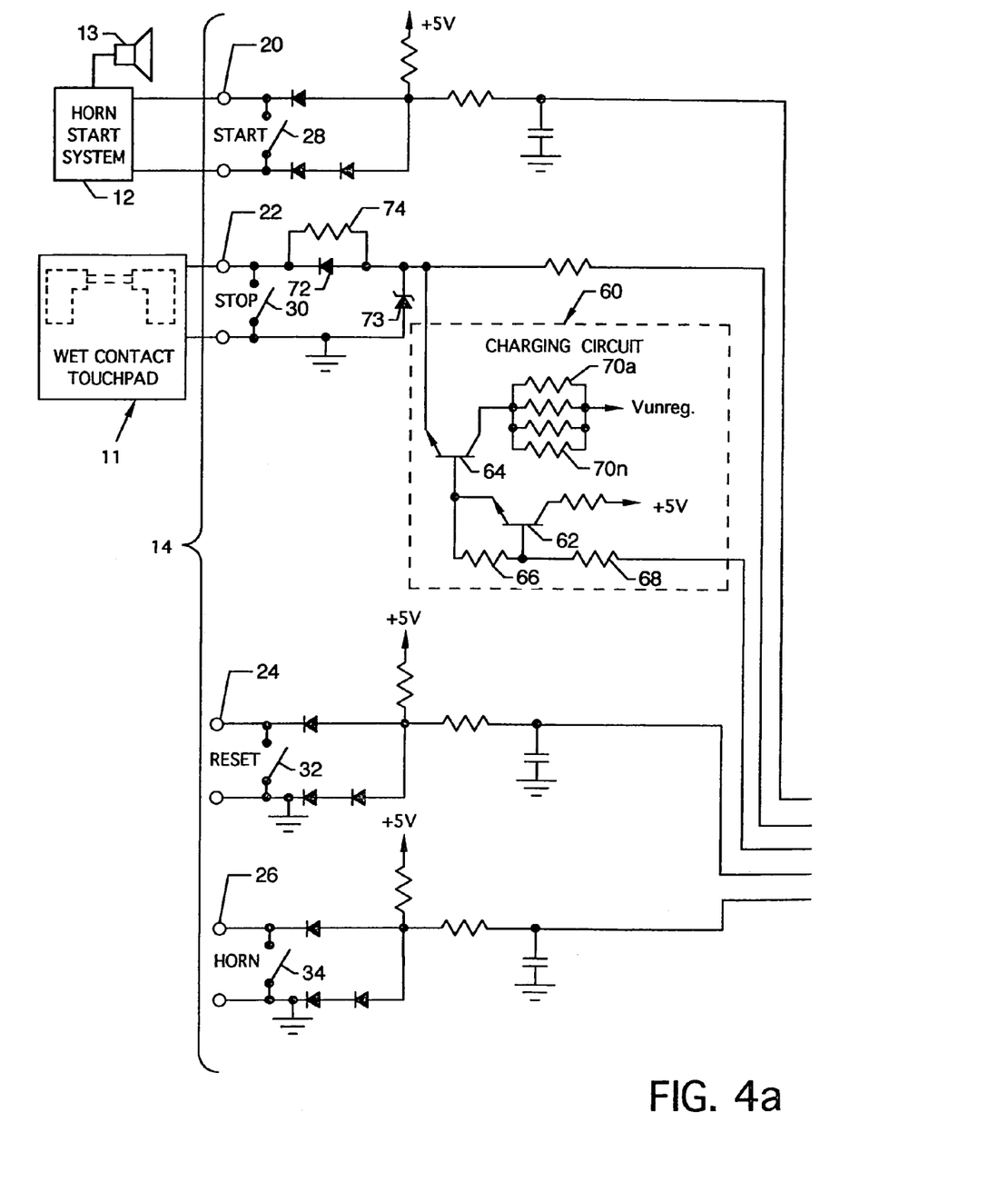
FIGS. 4a and 4b together represent an electrical schematic of the timer/controller, the present invention, connected to a wet contact touchpad and to a start system.
Figure 4B:
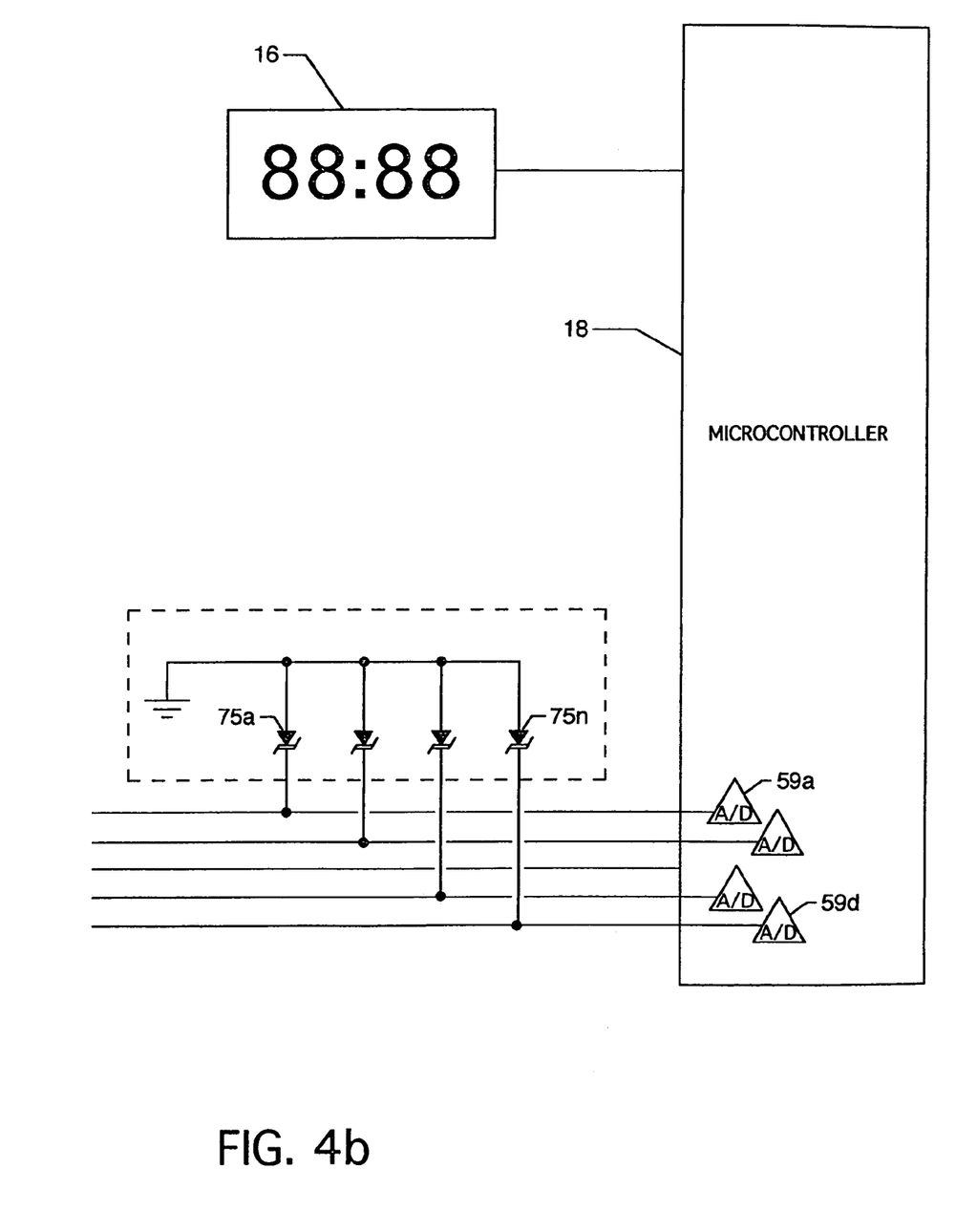

FIG. 3 illustrates the alignment of FIG. 4a with respect to FIG. 4b.

FIGS. 4a and 4b together represent an electrical schematic of the timer/controller 14, the present invention, connected to the wet contact touchpad 11 and to the horn start system 12 including the external start horn 13. With respect to monitoring the wet contact touchpad 11, the most pertinent part of the electrical schematic is the circuit connected to the STOP input jack 22. The three other sets of jacks have low voltage switch input jacks that are also monitored, and all the jacks use the A/D converters 59a–59d located internally in the microcontroller 18, but are not capable of sensing the release of a wet contact touchpad 11. The START input jack 20 is used to start an internal timer residing in the microcontroller 18. The function of the STOP input jack 22 is determined by the operating mode of the microcontroller 18, and the STOP input jack 22 can be connected to a touchpad, such as the wet contact touchpad 11, or to a simple external switch (not shown). The function of the HORN input jack 26 is also determined by the operating mode of the internal timer. The HORN input jack 26 may be connected to a take-off platform sensor (start reaction timing), or may be used to sound a horn when the switch 34 is closed. The RESET input jack 24 is used to reset the internal timer to zero in preparation for another timing event.

Shown in particular is a charging circuit 60 connected to the microcontroller 18. The microcontroller 18, with other components, monitors the status of the wet contact touchpad 11, samples and controls other aspects related to the wet contact touchpad 11, and is connected to the wet contact touchpad 11 by the STOP jack 22. The microcontroller 18 causes measured timed periods for an event or occurrence to be outputted by the display 16. Also shown in particular is the charging circuit 60 connected by the STOP jack pair 22 to, but not at all times, electrically influence the wet contact touchpad 11. The charging circuit 60, which also functions as a charging current switch, includes power transistors 62 and 64 and resistors 66, 68 and 70a–70n. The output of the charging circuit 60 is controlled by the microcontroller 18 to either provide or not provide charging current to the wet contact touchpad 11, as explained later in detail. In the STOP circuit, a diode 72 provides a low impedance path for the charging current from the charging circuit 60 out to the wet contact touchpad 11, while blocking any signal that a user may inadvertently connect to the input at the STOP jack 22. Resistor 74 allows the voltage on each side of the diode 72 to equalize, while still maintaining a high impedance to any signal the user may connect. A zener diode clamp 73 prevents the voltage from exceeding a predetermined value, which could damage the inputs of the microcontroller 18. Transient voltage surge suppressors 75a–75n are incorporated as protective devices across the leads from the circuitry connecting the START jack 20, the STOP jack 22, the RESET jack 24 and the HORN jack 26 to quickly react to voltage spikes by shunting any spikes to ground to avoid damaging the inputs of the microcontroller 18. The overall circuit can function satisfactorily without the transient voltage surge suppressors 75a–75n, but with the transient voltage surge suppressors 75a–75n, additional protection is provided in the event the current switching circuit (charging circuit 60) or external devices connected to the STOP input jack 22 or the other inputs produce transients that occur faster than the protection offered by the zener diode clamp 73.

Figure 5:
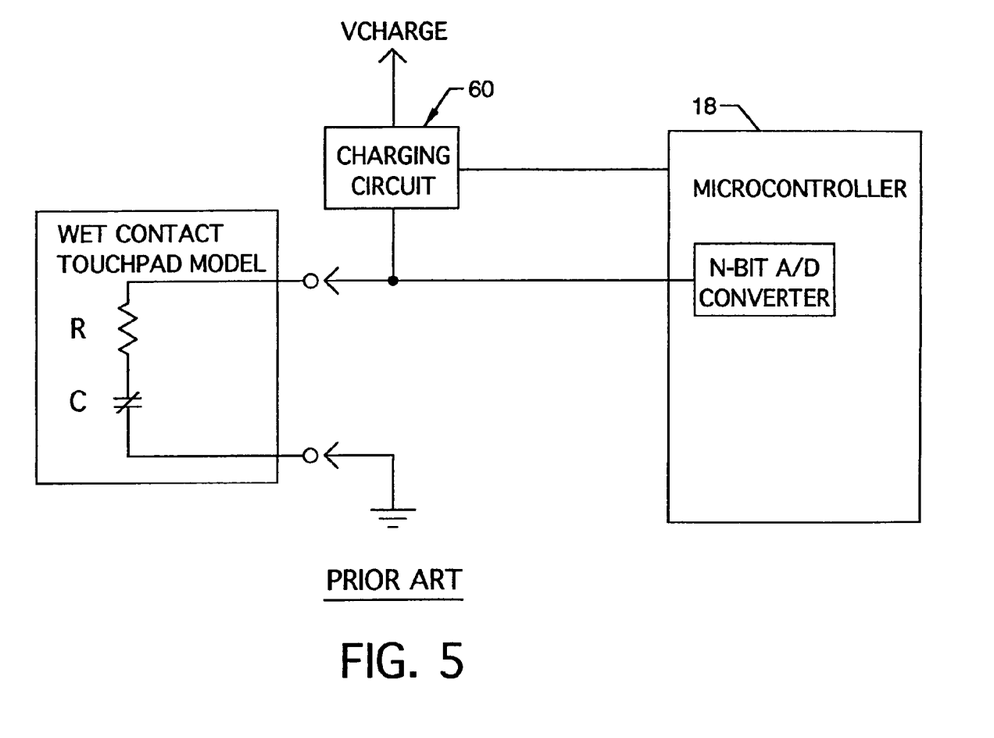
FIG. 5 is block diagram showing a wet contact touchpad model.

FIG. 5 is a block diagram of a prior art system involving a wet contact touchpad model and a microcontroller which activates an electrically connected starting signal, which may be visual and/or aural to start a swimming race and then measures the time involved until a swimmer touches the wet contact touchpad to signal the end of the race. In this prior art system, voltage across the wet contact touchpad is drawn down and sensed by a microprocessor, whereupon the elapsed time is displayed. Such system does not require fast recharging of the electrode plates of the wet contact touchpad, as only the end of a timed event is sensed. The capacitance found in many wet contact touchpads is on the order of 0.04F and the resistance can be approximated at 1 ohm. Using this as an example in the wet contact touchpad model, and using the 5RC approximation, it will take approximately 0.2 second to charge the capacitor up to full supply voltage (assuming that the output resistance of the charging circuit 60 is zero). In this regime, sensing of contact release of the wet contact touchpad is neither important nor supported. However, in the instant invention, other useful data can be obtained. For example, data referencing starting reaction time can be obtained, such being useful for training or for analyzing a swimmer's ability to quickly leave a starting mark or area. Also, data relating to actual away from the mark and return to the mark elapsed time without reference to or use of a visual or aural starting signal can be measured and displayed. Such sensing and display can require time sampling at a greater occurrence level where a new charge-up time significantly less than 0.2 second is desired. The charge-up time can be shortened significantly by quickly charging the capacitor (wet contact touchpad) by the use of a charging circuit controlled by a microcontroller to charge the wet contact touchpad from a higher than normal voltage supply, such as 16 volts for example, and by then turning the charging circuit off when the wet contact touchpad reaches a desired voltage, such as 0.25 volt. The RC constant of the circuit is still the same, but because the supply voltage is much higher than the desired charge voltage, the time to charge the wet contact touchpad to 0.25 volt is significantly shortened, thus leaving non-charging gaps for sampling. The wet contact touchpad voltage cannot be measured accurately while charging because the charging current through the resistance of the wet contact touchpad model causes a voltage drop which, when added to the voltage across the capacitance, will always be equal to the supply voltage. As such, this is recognized, and the charging circuit is turned off before measuring of the wet contact touchpad voltage occurs.

Figure 6:
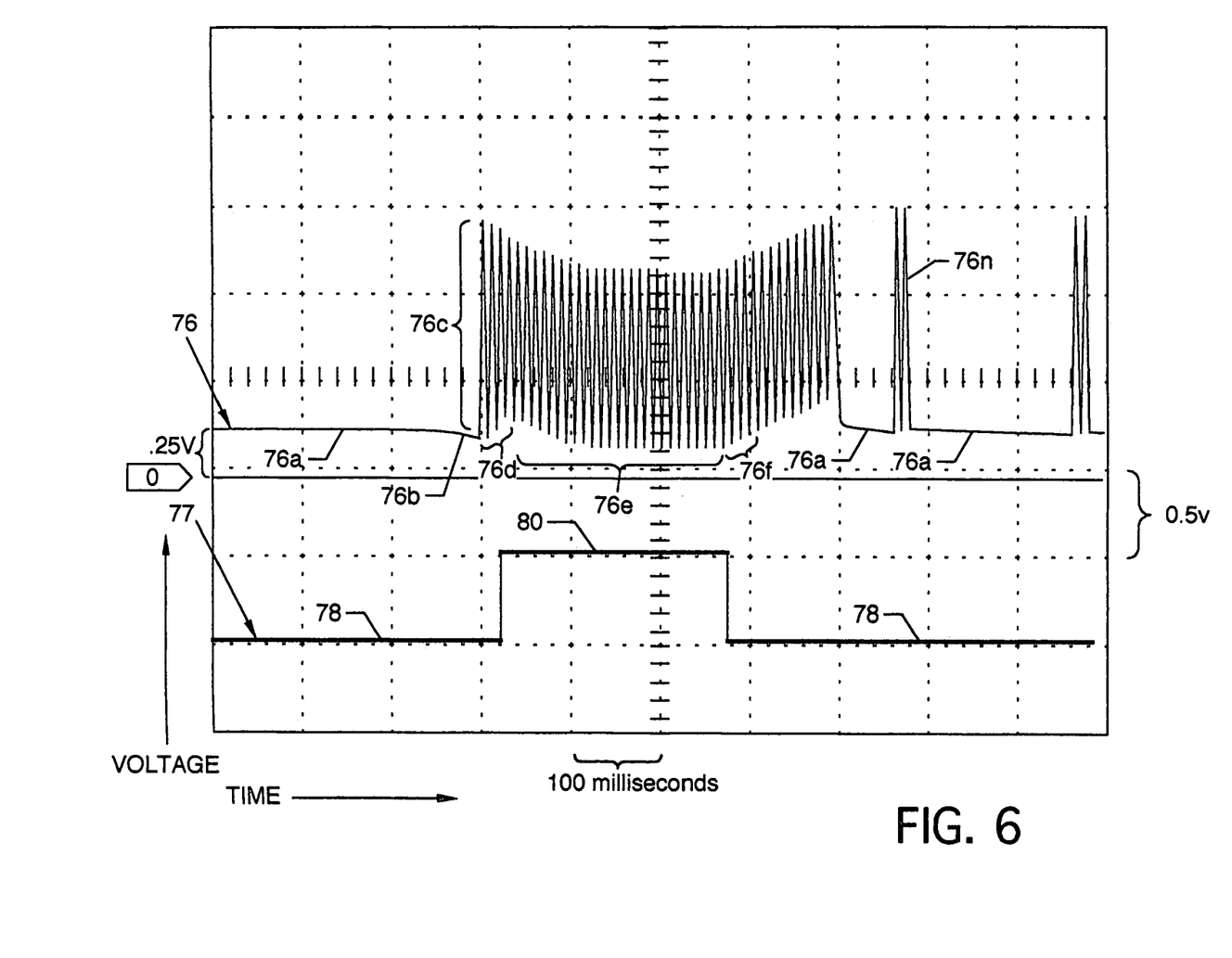
FIG. 6 illustrates the operation of the timer/controller shown in FIGS. 4a and 4b as witnessed on an oscilloscope.

FIG. 6 illustrates the operation of the timer/controller 14 shown in FIGS. 4a–4b, as may be witnessed on an oscilloscope. The top trace 76, including trace reference points or regions 76a–76n, indicates the voltage across the wet contact touchpad 11, and the bottom trace 77 indicates the output from the microcontroller 18, showing at 78 when the wet contact touchpad 11 is sensed as being in open status (output low) or at 80 when the wet contact touchpad 11 is sensed as being in closed status (output high). With the wet contact touchpad 11 open and fully charged, 0.25V is indicated at trace reference region 76a. At trace reference region 76b, decreasing voltage is sensed by the microcontroller 18, and the microcontroller 18 starts numerous charge/sample cycles (trace reference region 76c) where a high voltage charge is applied by the charging circuit 60 of the timer/controller 14 and, subsequently, is cut off at a desired voltage to allow interspersed voltage samplings free from the influence of charging. When n-consecutive samples of decreasing voltage (trace reference region 76d) are recognized by the microcontroller 18, the microcontroller 18 output indicates closed status, as indicated at 80, and initiates a signal based on "closure" to start timing for readout on the display 16. Such closed status, as indicated at 80, will continue until n-consecutive samples of increasing voltage occur. Accordingly, decreasing or steady voltage samples (trace reference region 76e) are monitored by the microcontroller 16 with no change of the closed status, as indicated at 80, to the open status, as indicated at 78. When n-consecutive samples of increasing voltage (trace reference region 76f) are recognized by the microcontroller 18, the microcontroller 18 output indicates open status, as indicated at 78, and initiates a signal based on "open" to terminate timing for readout on the display 16. Charge/sample cycles continue until a suitable voltage of at least or just slightly more than 0.25V (trace reference region 76a again) is attained, whereupon the charge/sample cycles cease, having reached a suitable charge state. The wet contact touchpad 11 can exhibit a certain amount of "leakage"; i.e., it will not retain a charge indefinitely even without being pressed. For this reason, the microcontroller 18 must be able to determine whether a drop in wet contact touchpad 11 voltage is due to leakage or due to a touch. This is accomplished by cycling the charging circuit 60 on and off twice (trace reference region 76n) and comparing the voltage samples taken after each charging cycle. If the samples are of increasing voltage, the wet contact touchpad 11 is not closed and the wet contact touchpad 11 needs to be recharged to compensate for leakage. If the two samples are decreasing, then the wet contact touchpad 11 is closed and timing functions are initiated.

Mode of Operation

The mode of operation of the apparatus for monitoring wet contact touchpads and the method for monitoring wet contact touchpads are best described in detail by reference to the previously described figures followed by a practical use example, which is now described. The timer/controller 14 utilizes four digits in the display 16 for displaying times, an internal horn (not shown), and four jack inputs 20, 22, 24 and 26, each paralleled with a switch, to facilitate the connection of external switches, start systems, touchpads, take-off platform sensors, etc. The timer/controller 14 has multiple modes of operation which can be set or influenced using the switches 28, 30, 32 and 34. One area of usefulness of the present invention that applies to the touchpad monitoring circuit, as found in the timer/controller 14, is the ability to measure start reaction time, such as in the backstroke. The timer/controller 14 starts timing when the START circuit is activated, such as by the horn start system 12, where the START jack 20 would normally be connected to a horn start system 12 which sounds a start tone through the start horn 13 and optionally causes a strobe to flash when the official starts the race. A set of relay contacts in the horn start system 12 is connected through a cable to the START jack 20 of the timer/controller 14. An alternate method of starting the timing could be by the closure of the start switch 28 which is in parallel with the start jack 20.

In a backstroke race, the swimmers start in the water by placing their feet against wet contact touchpads 11 and holding the starting block (or pool gutter) with their hands. When the swimmers place their feet against the wet contact touchpads 11, the flexible metal electrode plates 48 and 50 and 52 and 54 are forced into intimate contact, thereby causing sensing by the timer/controller 14. When the swimmers hear the start signal, they push off and the contacts of the wet contact touchpads separate. A swimmer may move his feet on the touchpad and cause multiple cycles of the wet contact touchpad 11, so the timer/controller 14 monitors the cycles and uses the last opening of the contacts of the wet contact touchpad 11 after the start to stop the timing. The time between the START input and the last opening of the STOP input is the start reaction time, which is then displayed on the display 16. Alternatively, total elapsed time could be accurately determined without the use of a starting signal by determination by the timer/controller 14 of the time between the opening of the contacts of the wet contact touchpad 11 (departure from the wet contact touchpad 11) and the closure of the contacts of the wet contact touchpad 11 (return touching of the wet contact touchpad 11).

Various modifications can be made to the present invention without departing from the apparent scope thereof.

PARTS LIST

| | |
|---|---|
| 10 | apparatus for monitoring wet contact touchpads |
| 11 | wet contact touchpad |
| 12 | horn start system |
| 13 | start horn |
| 14 | timer/controller |
| 16 | display |
| 18 | microcontroller |
| 20 | start jack |
| 22 | stop jack |
| 24 | reset jack |
| 26 | horn jack |
| 28 | start switch |
| 30 | stop switch |
| 32 | reset switch |
| 34 | horn switch |
| 36 | start plug |
| 38 | stop plug |
| 40 | reset plug |
| 42 | horn plug |
| 44 | front panel |
| 46 | rear panel |
| 48 | flexible metal electrode plate |
| 50 | flexible metal electrode plate |
| 52 | flexible metal electrode plate |
| 54 | flexible metal electrode plate |
| 56a–n | non-conducting separators |
| 57 | space |
| 58 | connection cable |
| 59a–n | A/D converters |
| 60 | charging circuit |
| 62 | transistor |
| 64 | transistor |
| 66 | resistor |
| 68 | resistor |
| 70a–n | resistors |
| 72 | diode |
| 73 | zener diode clamp |
| 74 | resistor |
| 75a–n | transient voltage surge suppressors |
| 76 | top trace |
| 76a | trace reference region (full charge) |
| 76b | trace reference region (decreasing voltage) |
| 76c | trace reference region (charge sample cycles) |
| 76d | trace reference region (decreasing voltage) |
| 76e | trace reference region (decreasing or steady voltage) |
| 76f | trace reference region (increasing voltage) |
| 76n | trace reference region (cycling on and off twice) |
| 77 | bottom trace |
| 78 | open status |
| 80 | closed status |

The invention claimed is:

1. An apparatus to accurately detect "touch" events and "release" events of a wet contact touchpad having spaced apart plates and water between the spaced apart plates comprising:
   a. a charging circuit at a first voltage connected to the spaced apart plates so as to provide a charge to the plates of the wet contact touchpad in a first time period;
   b. an electronic switching system to disconnect the charging system from the spaced apart plates when the charge on the plate reaches at a selected second voltage, the second voltage being lower than the first voltage, and the disconnection beginning a second time period;
   c. a monitoring system for sensing the voltage between the spaced apart plates; and,
   d. a signal system for detecting a selected number "n" of successive decreasing voltages between the spaced apart plates during second time periods, thereby detecting a "touch" event and issuing a "touch" signal.

2. The apparatus of claim 1, wherein the spaced apart plates are reconnected to the charging system immediately following a detected "touch" event so as to charge the spaced apart plates in preparation for detecting a "release" event.

3. The apparatus of claim 1, wherein the signal system detects "release" events as a selected number "n" of successive increasing voltages between the spaced apart plates during second time periods following a "touch" event and issuing a "release" signal.

4. The apparatus of claim 1, wherein the electronic switching system includes a microcontroller interfaced to an analog-to-digital converter (ADC) to monitor the voltage in combination with a transistor switch arrangement, wherein the microcontroller continually samples the voltage through the ADC.

5. The apparatus of claim 1, wherein the second voltage is not more than about 1.3 volts.

6. The apparatus of claim 1, wherein the first voltage is about 16 volts.

7. The apparatus of claim 6, wherein the second voltage is about 0.25 volt.

8. The apparatus of claim 1, wherein the "release" event signal is corrected by deducting for time estimated to achieve the first increased voltage.

9. The apparatus of claim 1, further comprising:
   a. a timer system receiving the signals; and,
   b. a scoreboard displaying results from the timer system.

10. The apparatus of claim 9, wherein the timer system receives signals from a plurality of touchpads.

11. A method to accurately detect the touch and the release of a wet contact touchpad by sampling rates of decreasing or increasing voltage sampled between rapidly occurring charging cycles, the method comprising the steps of:
   a. providing a wet contact touchpad, the touchpad having flexible spaced apart plates and water between the spaced apart plates;
   b. electronically connecting the touchpad plates to a charging source and charging the plates with a first voltage, so as to reach a second charge voltage between the plates, the second charge voltage being less than the first voltage;
   c. electrically disconnecting the plates from the charging source when the second charged voltage is reached;
   d. monitoring the voltage of the charge between the plates using an analog-to-digital converter (ADC);
   e. using a transistor switch arrangement to control the connection and disconnection of the charging source; and,
   f. detecting a "touch" when "n" number of sequential decreasing samples of the charge between the plates are detected.

12. The method of claim 11, further comprising the steps:
   a. immediately connecting the charging source when a "touch" has been detected to prepare for detecting a release; and,
   b. detecting a release when sequential increasing charge voltages are detected between the plates.

13. The method of claim 12, further comprising the steps of:
   a. signaling a "touch" when a "touch" is detected; and,
   b. signaling a "release" when a "release" is detected.

14. The method of claim 13, further comprising the step of calculating the corrected time of a "release" based upon the RC parameters of the touchpad and the initial charge voltage observed with the "release" event.

15. A method to accurately detect the touch and the release of a wet contact touchpad by sampling rates of decreasing or increasing voltage sampled between rapidly occurring charging cycles, the method comprising the steps of:
   a. connecting a charger to the plates to charge the plates;
   b. disconnecting the charger from the plates after a selected time interval;
   c. measuring the charge voltage between the plates;
   d. recording the measured charge voltage;
   e. reconnecting the charger to the plates to recharge the plates;
   f. disconnecting the charger from the plates after the selected time;
   g. measuring the new charge voltage between the plates;
   h. comparing the new charge voltage to the recorded charge voltage to observe an increase or decrease in measured voltage after charging;
   i. recording the increase or decrease; and,
   j. detecting "n" consecutive increases or deceases so as to observe a "touch" event, wherein the "touch" event is defined as "n" consecutive decreases in charge voltage after charging and "release" is defined as "n" consecutive increases in charge voltage after charging.

16. The method of claim 15, further comprising the step of using an estimated approximate RC time constant to subtract time to yield an estimated corrected time at which "release" occurred.

* * * * *